United States Patent [19]

Ko et al.

[11] Patent Number: 5,302,540

[45] Date of Patent: Apr. 12, 1994

[54] METHOD OF MAKING CAPACITOR

[75] Inventors: Jaehong Ko; Sungtae Kim, both of Seoul; Hyunbo Shin, Kyunggi, all of Rep. of Korea

[73] Assignee: SamSung Electronics Co., Ltd., Kyunggi, Rep. of Korea

[21] Appl. No.: 872,514

[22] Filed: Apr. 23, 1992

[30] Foreign Application Priority Data

Nov. 16, 1991 [KR] Rep. of Korea .................. 91-20419

[51] Int. Cl.$^5$ .................................. H01L 21/70
[52] U.S. Cl. ............................... 437/47; 437/52; 437/60; 437/233; 437/238; 437/919; 437/977
[58] Field of Search .................. 437/47, 48, 52, 60, 437/228, 233, 238, 919, 977

[56] References Cited

U.S. PATENT DOCUMENTS 4,179,311  12/1979  Athanas .................. 437/56

Primary Examiner—Tom Thomas
Attorney, Agent, or Firm—Francis C. Hand

[57] ABSTRACT

A capacitor includes a first conductive layer having a plurality of cylindrical sections, dielectric film formed along the surface of the cylindrical sections and a second conductive substrate formed thereon. A semiconductor device is formed with the capacitor, has an increased capacitance and the integration of the semiconductor device is improved.

12 Claims, 3 Drawing Sheets

METHOD OF MAKING CAPACITOR

This invention relates to a capacitor and a method of making a capacitor. More particularly, this invention relates to a capacitor for a semiconductor device and a manufacturing method for making a semiconductor device.

BACKGROUND OF THE INVENTION

As is known, remarkable progress has been made in the manufacture of Dynamic Random Access Memories (DRAM) using high integration technology. For example, main stream production has changed from 64K bits to 256K bits, and the manufacture of from 1Mbit DRAMs to 64M bit DRAMs has been achieved.

In such a DRAM with high integration, a predetermined capacitance of the cell storage capacitor must be kept constant, despite the decrease in the area of the cells. For example, the area of a cell in a 64M bit DRAM decreases to about 1.4 $\mu m^2$.

In the case where the areas of charge storage capacitors are also decreased and the capacitance becomes small, a so-called soft error occurs on exposure to $\alpha$-light, and the problem of reliability on a semiconductor device becomes an issue. Therefore, in order to obtain an improved integration of a semiconductor device, the capacitance of cell storage capacitors must be kept constant, despite the decrease in the areas of the capacitors.

In a recent DRAM whose storage cells are based on transistor-stacked capacitor combinations, one of a pair of electrodes of a storage capacitor has been formed to have a three-dimensional structure. This makes the capacitance larger by 30 to 40% than that of a two-dimensional storage capacitor having the same size as the three-dimensional one. In the case of 64M bit DRAMs having high integration, the capacitance needs to increase without the increase of cell areas or storage area, and various three-dimensional structures or high dielectric constant have been studied.

One method for obtaining a high capacitance in defined small areas of capacitors, such as the above three-dimensional DRAMs, is described in "Solid State Device & Material No. 90-167", page 49, published December, 1990. A method for manufacturing the same will be described in the light of the accompanying drawings.

SUMMARY OF THE INVENTION

Accordingly, it is an object or the present invention to decrease the size of an existing capacitor without decreasing the capacitance of the capacitor.

It is another object of the invention to provide a relatively simple technique for constructing a capacitor having an increased area of capacitance.

It is another object of the invention to provide a relatively simple manufacturing technique for forming a semiconductor device having a relatively small size and a relatively high capacitance.

Briefly, the invention provides a capacitor having a first conductive layer with a plurality of cylindrical sections, a dielectric film over the conductive layer and the cylindrical sections, and a second conductive layer disposed over the dielectric film.

Each layer of the capacitor may be made of a material selected from the group consisting of doped polysilicon, in-situ doped polysilicon, doped amorphous silicon and tungsten. In addition, the dielectric film may be of a material selected from the group consisting of a double film of nitride/oxide films, a triple film of oxide/nitride/oxide films and a tantalum oxide ($Ta_2O_5$) film.

The invention also provides a method of manufacturing a capacitor. This method includes the steps of forming a first conductive layer, then forming an oxidation impervious barrier on the conductive layer and depositing a polysilicon layer having hemispherical sections thereon, by a low pressure chemical vapor deposition, and forming a silicon oxide film by oxidizing the polysilicon layer. Next, the oxidation impervious barrier and silicon oxide film are dry-etched to expose partial sections of the first conductive layer. This is followed by anisotropically etching the first conductive layer to a predetermined depth by using of the remaining oxidation impervious barriers and silicon oxide films as a mask. Thereafter, the remainder of the oxidation impervious barriers and silicon oxide films are removed to expose the etched surface of the first conductive layer and a dielectric film is formed along the etched surface of the first conductive layer. This is followed by forming a second conductive layer over the dielectric film.

BRIEF DESCRIPTION OF THE DRAWINGS

FIG. 1 is a sectional view of a stacked capacitor type DRAM having storage node electrodes of hemispherical section. In making this DRAM, a field oxide film 11 is formed on a silicon substrate 10, and after isolating elements, gate electrode 12, source/drain regions 13 and 13' and an inter-layered oxide film 14 are serially formed. A predetermined storage node polysilicon layer 16 is then deposited by a chemical vapor deposition under low pressure and at 550° C. At this temperature, amorphous and polycrystalline structures coexist, and the surface areas of silicon grains (which have a hemispherical shape are maximized. After that, an insulating film 18 is formed on the polysilicon layer 16, and a plate electrode 19 is then deposited thereon whereby the formation of a three dimensional stacked capacitor type DRAM is completed.

In such a conventional art technology, however, even if the capacitance increases in defined areas of the capacitors, there is a great demand for capacitors with a capacitance more than the conventional ones. Therefore, in order to improve a high integration semiconductor devices, the capacitance of capacitors needs to be larger and a corresponding manufacturing method must also be simplified.

DESCRIPTION OF THE PREFERRED EMBODIMENTS

Figure 1:
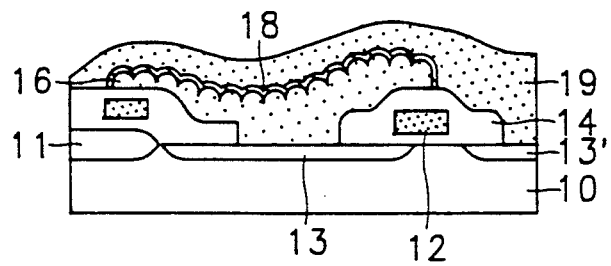
FIG. 1 is a sectional view of a known stacked capacitor type DRAM having winding storage node electrodes of hemispherical sections.
Figure 2A:
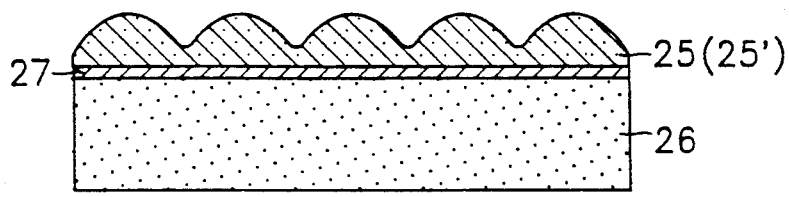
FIGS. 2A to 2E show a process for manufacturing a capacitor having a plurality of cylindrical configurations in accordance with the invention.

Referring to FIG. 2A, the stacked capacitor has a first conductive layer 26 deposited on a substrate (not shown) to a thickness of about 500 to 5000 angstroms, a nitride film formed to a thickness of about 100 to 500 angstroms to form an oxidation impervious barrier and a second polysilicon layer 25 deposited to a thickness of 300 to 2000 angstroms thereon. In this capacitor, the first conductive layer 26 is chosen from among doped polysilicon, in-situ doped polysilicon, amorphous silicon or tungsten In addition, the second polysilicon layer 25 is deposited by a chemical low pressure vapor deposition (LP CVD) at about 550° to 600° C. This predetermined temperature is a transition temperature at which the structure of the polysilicon changes from being amorphous to being polycrystalline, and the surface area of the second polysilicon deposited at this temperature become maximized. The second polysilicon layer 25 forms hemispherical sections at this temperature. The second polysilicon layer 25 is then oxidized in a furnace to form a silicon oxide film 25'.

Figure 2B:
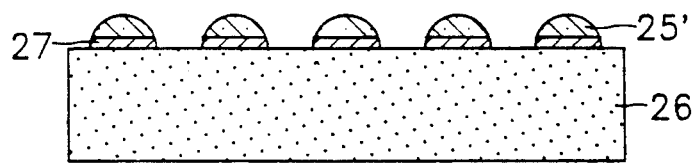

As shown in FIG. 2B, the oxidation impervious barrier 27 and silicon oxide films 25' are thereafter anisotropically etched by dry-etching, and the first conductive layer 26 is partially exposed.

Figure 2C:
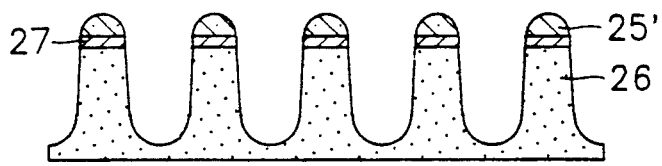

Subsequently, using the remainder of the oxidation impervious barrier 27 and silicon oxide films 25' as a mask, the first polysilicon layer 26 is anisotropically etched to a depth of 80 to 90% of the first polysilicon layer itself as shown in FIG. 2C.

Figure 2D:
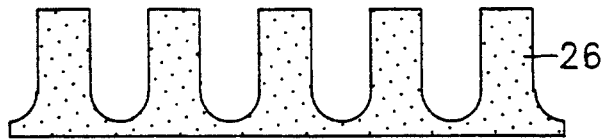

In FIG. 2D, by removing the oxidation impervious barriers 27 and silicon oxide films 25', there remains just the first polysilicon layer 26 having a plurality of cylindrical sections each of which projects transversely of the layer 26.

Figure 2E:
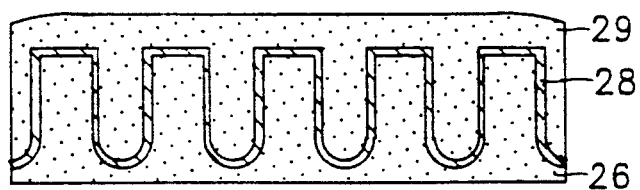

As illustrated in FIG. 2E, a dielectric film 28 is formed along the surface of the first polysilicon layer 26, and a second conductive layer 29 is formed thereon whereby forming a capacitor according to the present invention is completed.

The dielectric film 28 is preferably formed of a double film of nitride/oxide films; a triple film of oxide/nitride/oxide films; or a high dielectric film such as $Ta_2O_5$. The second conductive layer 29 which is a substrate on the upper portion of the capacitor is formed of doped polysilicon, in-situ doped polysilicon, amorphous silicon, or tungsten.

A method for manufacturing a semiconductor device having the above capacitor will now be described with reference to FIGS. 3A to 3G.

Figure 3A:
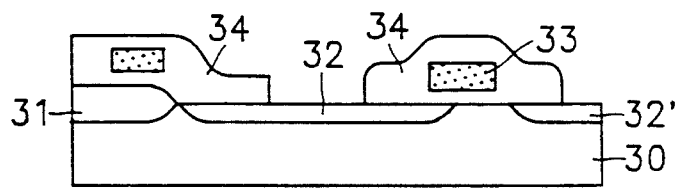
FIGS. 3A to 3G show a process for manufacturing a DRAM including a capacitor having a plurality of cylindrical sections according to the present invention.

As shown in FIG. 3A, a region where electrical elements are isolated is formed with a field oxide film 31 on a p-type semiconductor substrate, and after forming gate electrodes 33, source/drain impurity regions 32 and 32, are formed by ion-implantation to complete a transistor structure. At over 700° C., preferably at 850° C., a high temperature oxide film (HTO film) 34 is formed by a known chemical vapor deposition (CVD). The source region is then opened, i.e. partially exposed.

Figure 3B:
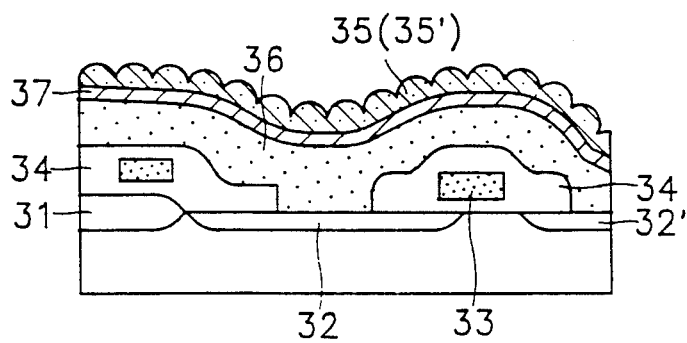

After that a storage node polysilicon layer 36 which acts as a first conductive layer having one surface in contact with the transistor structure is deposited to a thickness of about 500 to 5000 angstroms on the upper portion of the transistor structure as shown in FIG. 3B. An oxidation impervious barrier 37 made of, for example, a nitride film is then formed on the layer 36 to a thickness of 100 to 500 angstroms. A polysilicon layer 35 is then deposited on the nitride film 37. In this process, the first conductive layer 36 is chosen from among doped polysilicon, in-situ doped polysilicon, amorphous silicon or tungsten. In addition, the above mentioned polysilicon layer 35 is deposited by LP CVD at 550° to 600° C. This predetermined temperature is a transition temperature at which the structure of the polysilicon changes from being amorphous to being polycrystalline, and the surface area of the polysilicon deposited at this temperature become maximized. The polysilicon layer 35 has hemispherical sections at this temperature, and the polysilicon layer 35 is oxidized in a furnace to form a silicon oxide film 35'.

Figure 3C:
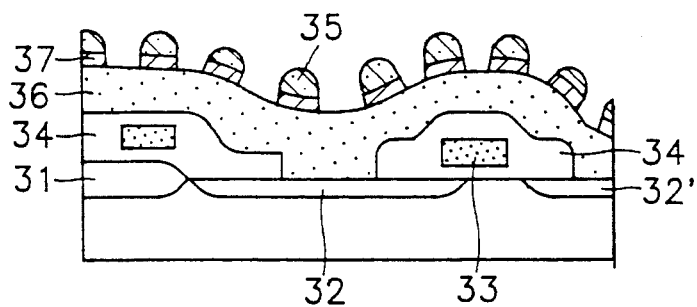

As illustrated in FIG. 3C, by dry etching the oxidation impervious barriers 37 and silicon oxide film 35' in a conventional manner, just the first polysilicon layer 36 which is the first conductive layer is partially exposed.

Figure 3D:
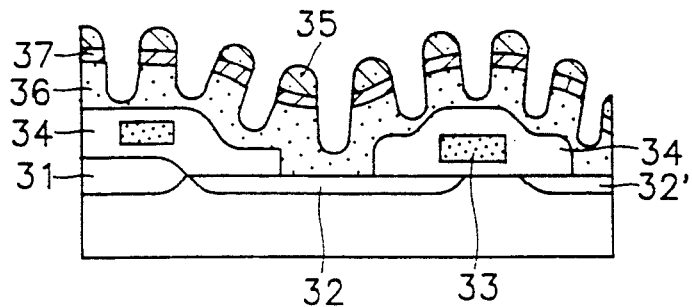

Subsequently, according to FIG. 3D, by using the remainder of the oxidation impervious barrier 37 and silicon oxide film 35' as a mask, the first conductive layer 36 is anisotropically etched to a depth of 80 to 90% of the thickness of the first conductive layer 36 itself.

Figure 3E:
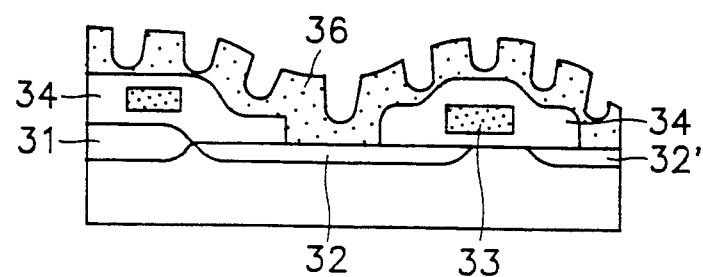

As shown in FIG. 3E, by removing the oxidation impervious barriers 37 and silicon oxide films 35', there remains just the first conductive layer 36 having a plurality of cylindrical sections, each of which projects from the upper surface of the layer 36.

Figure 3F:
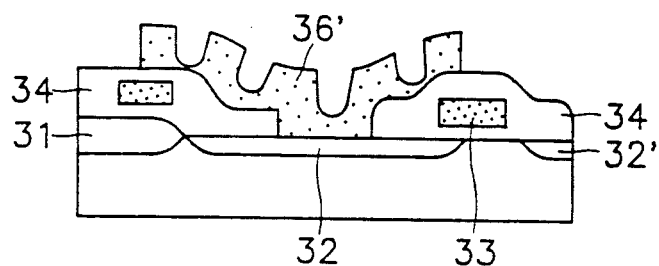

A storage electrode 36' is then formed by patterning the first conductive layer 36 as shown in FIG. 3F.

Figure 3G:
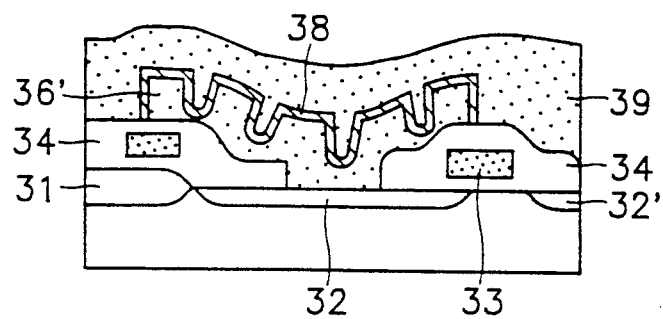

According to FIG. 3G, a dielectric film 38 is formed along the surface of the storage electrode 36' and a plate electrode is formed thereon. The dielectric film 38 is preferably formed of a double film of nitride/oxide films; a triple form of oxide/nitride/oxide films or a high dielectric film such as tantalum oxide ($Ta_2O_5$). The plate electrode 39 which is a substrate of the capacitor is formed of a conductive layer, for example, doped polysilicon, in-situ doped polysilicon, amorphous silicon or tungsten. In such a manner, a semiconductor device comprising the capacitors of the present invention is completed.

The invention thus provides capacitors with enlarged surface areas because of the plurality of projecting cylindrical sections on the first conductive layer whereby the capacitance and the integration of DRAMs is more improved.

What is claimed is:

1. A method for manufacturing a capacitor comprising the steps of
   forming a first conductive layer;
   forming an oxidation impervious barrier on a surface first conductive layer;
   depositing a polysilicon layer having hemispherical sections on a surface thereof onto the oxidation impervious barrier;
   oxidizing the polysilicon layer to form a silicon oxide film thereon;
   dry-etching the oxidation impervious barrier and silicon oxide film to expose partial sections of the first conductive layer;
   anisotropically etching the exposed sections of the first conductive layer;
   thereafter removing the remainder of the oxidation impervious barrier and silicon oxide film to expose the etched surface of the first conductive layer;
   then forming a dielectric film along said etched surface of the first conductive layer:
   then forming a second conductive layer over the dielectric film.

2. A method as set forth in claim 1 wherein the first conductive layer and second layer are made of one of doped polysilicon, in-situ doped polysilicon, doped amorphous silicon and tungsten.

3. A method as set forth in claim 1 wherein the first conductive layer has a thickness of from 500 to 5000 angstroms.

4. A method as set forth in claim 1 wherein said dielectric film is formed of one of a double film of nitride/oxide films, a triple film of oxide/nitride/oxide films and a tantalum oxide ($Ta_2O_5$) film.

5. A method as set forth in claim 1 wherein said oxidation impervious film is a nitride film.

6. A method as set forth in claim 1 wherein the oxidation impervious film has a thickness of from 100 to 500 angstroms.

7. A method for manufacturing a semiconductor device comprising the steps of
    forming a field oxide film on a semiconductor substrate;
    forming source/drain impurity regions on the substrate by ion-implantation;
    forming gate electrodes on the substrate;
    forming an inter-layered insulating film over the source/drain impurity regions and gate electrodes;
    thereafter removing sections of the insulating film to expose the source regions;
    forming a first conductive layer over the exposed source regions and the remainder of the insulating film;
    forming an oxidation impervious barrier on a surface of the first conductive layer;
    depositing a polysilicon layer having hemispherical sections on a surface thereof onto the oxidation impervious barrier;
    oxidizing the polysilicon layer to form a silicon oxide film thereon;
    dry-etching the oxidation impervious barrier and silicon oxide film to expose partial sections of the first conductive layer;
    anisotropically etching the exposed sections of the first conductive layer;
    thereafter removing the remainder of the oxidation impervious barriers and silicon oxide film to expose the etched surface of the first conductive layer;
    pattern in the first conductive layer to form a storage electrode;
    forming a dielectric film along the surface of the storage electrode;
    and then forming a second conductive layer on the dielectric film.

8. A method as set forth in claim 7 wherein said first conductive substrate and second conductive layer and second conductive layer are made of one of doped polysilicon, doped amorphous silicon, in-situ doped polysilicon and tungsten respectively.

9. A method as set forth in claim 7 wherein said first conductive layer has a thickness of from 500 to 5000 angstroms.

10. A method as set forth in claim 7 wherein said oxidation impervious barrier is a nitride film.

11. A method as set forth in claim 7 wherein said oxidation impervious barrier has a thickness of from 100 to 500 angstroms.

12. A method as set forth in claim 7 wherein said dielectric film is formed of one of a double film of nitride/oxide films, a triple film of oxide/nitride/oxide films and a tantalum oxide ($Ta_2O5$) film.

* * * * *

UNITED STATES PATENT AND TRADEMARK OFFICE
CERTIFICATE OF CORRECTION

PATENT NO. : 5,302,540
DATED : April 12, 1994
INVENTOR(S) : JAEHONG, KO ET AL It is certified that error appears in the above-identified patent and that said Letters Patent is hereby corrected as shown below:

Column 2, line 46 after "shape" insert -()-

Line 66 after "barrier" insert -27-

Column 4, line 43 after "surface" insert -of the-

Column 6, line 9 change "pattern in" to -patterning-

Line 16 to 17 cancel "and second conductive layer"

Signed and Sealed this

Twenty-seventh Day of September, 1994

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO : 5,302,540
DATED : April 12, 1994
INVENTOR(S) : Jaehong, Ko, et. al.

It is certified that error appears in the above-identified patent and that said Letters Patent is hereby corrected as shown below:

On the Title page, item [73], Assignee: should read --Samsung--.

Signed and Sealed this

Sixth Day of December, 1994

Attest:

BRUCE LEHMAN

Attesting Officer     Commissioner of Patents and Trademarks